US007281233B1

(12) United States Patent
Sivasubramaniam

(10) Patent No.: US 7,281,233 B1
(45) Date of Patent: Oct. 9, 2007

(54) METHOD AND APPARATUS FOR IMPLEMENTING A CIRCUIT DESIGN FOR INTEGRATED CIRCUITRY ON A CIRCUIT BOARD

(75) Inventor: Suresh Sivasubramaniam, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 33 days.

(21) Appl. No.: 11/140,020

(22) Filed: May 27, 2005

(51) Int. Cl.
*G06F 17/50* (2006.01)
(52) U.S. Cl. .......................... 716/15; 716/18
(58) Field of Classification Search ............. 716/4, 716/7, 16, 18, 10, 13–15; 71/15
See application file for complete search history.

(56) References Cited

U.S. PATENT DOCUMENTS

| 5,572,436 | A * | 11/1996 | Dangelo et al. ............. 716/18 |
| 5,659,484 | A * | 8/1997 | Bennett et al. .............. 716/16 |
| 6,145,117 | A * | 11/2000 | Eng ............................ 716/18 |
| 6,360,356 | B1 * | 3/2002 | Eng ............................ 716/18 |
| 6,978,430 | B2 * | 12/2005 | McElvain et al. ............ 716/7 |
| 7,117,467 | B2 * | 10/2006 | Ali et al. .................... 716/10 |
| 2003/0149954 | A1 * | 8/2003 | McElvain et al. ........... 716/18 |
| 2004/0010766 | A1 * | 1/2004 | Swope ........................ 716/15 |
| 2005/0044521 | A1 * | 2/2005 | Swope ........................ 716/15 |
| 2006/0036987 | A1 * | 2/2006 | Ali et al. ..................... 716/15 |

OTHER PUBLICATIONS

Scott Hauk, Gaetano Borriello; "Pin Assignment for MUlti-FPGA Systems"; IEEE Transactions on Computer-Aided Design of Integrated Circuits and Systems; vol. 16, No. 9; Sep. 1997; pp. 956-964.
Vinoo Srinivasan et al.; "Interconnect Synthesis for Reconfigurable Multi-FPGA Architectures"; pp. 1-9, 1999.

* cited by examiner

*Primary Examiner*—Stacy A Whitmore
(74) *Attorney, Agent, or Firm*—Robert Brush; Kevin T. Cuenot

(57) ABSTRACT

Method and apparatus for implementing a circuit design for at least one integrated circuit on a circuit board is described. In one example, a logical description of the circuit design is obtained. For example, a functional description of the circuit design may be synthesized to produce the logical description. Logical pins in the logical description are assigned to input/output (I/O) elements of the at least one integrated circuit, and the logical description is placed and routed for the at least one integrated circuit, based on external constraint data associated with the circuit board and internal logic constraint data associated with each of the at least one integrated circuit.

20 Claims, 7 Drawing Sheets

US 7,281,233 B1

METHOD AND APPARATUS FOR IMPLEMENTING A CIRCUIT DESIGN FOR INTEGRATED CIRCUITRY ON A CIRCUIT BOARD

FIELD OF THE INVENTION

One or more aspects of the present invention relate generally to integrated circuit design tools and, more particularly, to a method and apparatus for implementing a circuit design for integrated circuitry on a circuit board.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (known as a bitstream) into internal configuration memory cells that define how the CLBs, IOBs, and interconnect structure are configured. An FPGA may also include various dedicated logic circuits, such as memories, microprocessors, digital clock managers (DCMs), and input/output (I/O) transceivers.

To implement a circuit design using one or more FPGAs disposed on a circuit board, a logic designer produces a functional description of the circuit design using a suitable hardware description language (HDL), such as the Very high-speed integrated circuit Hardware Description Language (VHDL) and VERILOG. The HDL code is then synthesized to produce a logical representation of the circuit design. The physical implementation of the circuit design is realized by placing and routing the synthesized circuit design in the FPGA(s) using the programmable logic blocks and programmable logic fabric. The place and route phases of implementing a circuit design involve generating a layout of the circuit elements on the FPGA(s) and defining the signal lines (routing resources) that connect the elements. Typically, the place and route phase is iterated until the design meets timing constraints established by the logic designer.

When the designer achieves timing closure in the place and route phase, schematics are produced with a particular pin configuration. If no attention has been paid to circuit board level routing requirements, the selected pin configuration can increase costs. For example, the selected pin configuration may increase the number of layers in the circuit board to route the signals or the problem may not be solvable manually by a layout designer in a reasonable period of time. The problem is further magnified when there are multiple FPGAs on the circuit board. Conventionally, the process of pin assignment and placement and layout of the devices on the circuit board is handled by back and forth discussions between the design team and the circuit board layout team. Depending on the complexity and pin count, closing this loop may take many weeks.

Accordingly, there exists a need in the art for an improved method and apparatus for implementing a circuit design for integrated circuitry on a circuit board.

SUMMARY OF THE INVENTION

Method and apparatus for implementing a circuit design for at least one integrated circuit on a circuit board is described. In one embodiment, a logical description of the circuit design is obtained. For example, a functional description of the circuit design may be synthesized to produce the logical description. Logical pins in the logical description are assigned to input/output (I/O) elements of the at least one integrated circuit, and the logical description is placed and routed for the at least one integrated circuit, based on external constraint data associated with the circuit board and internal logic constraint data associated with each of the at least one integrated circuit.

BRIEF DESCRIPTION OF THE DRAWINGS

Accompanying drawing(s) show exemplary embodiment (s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
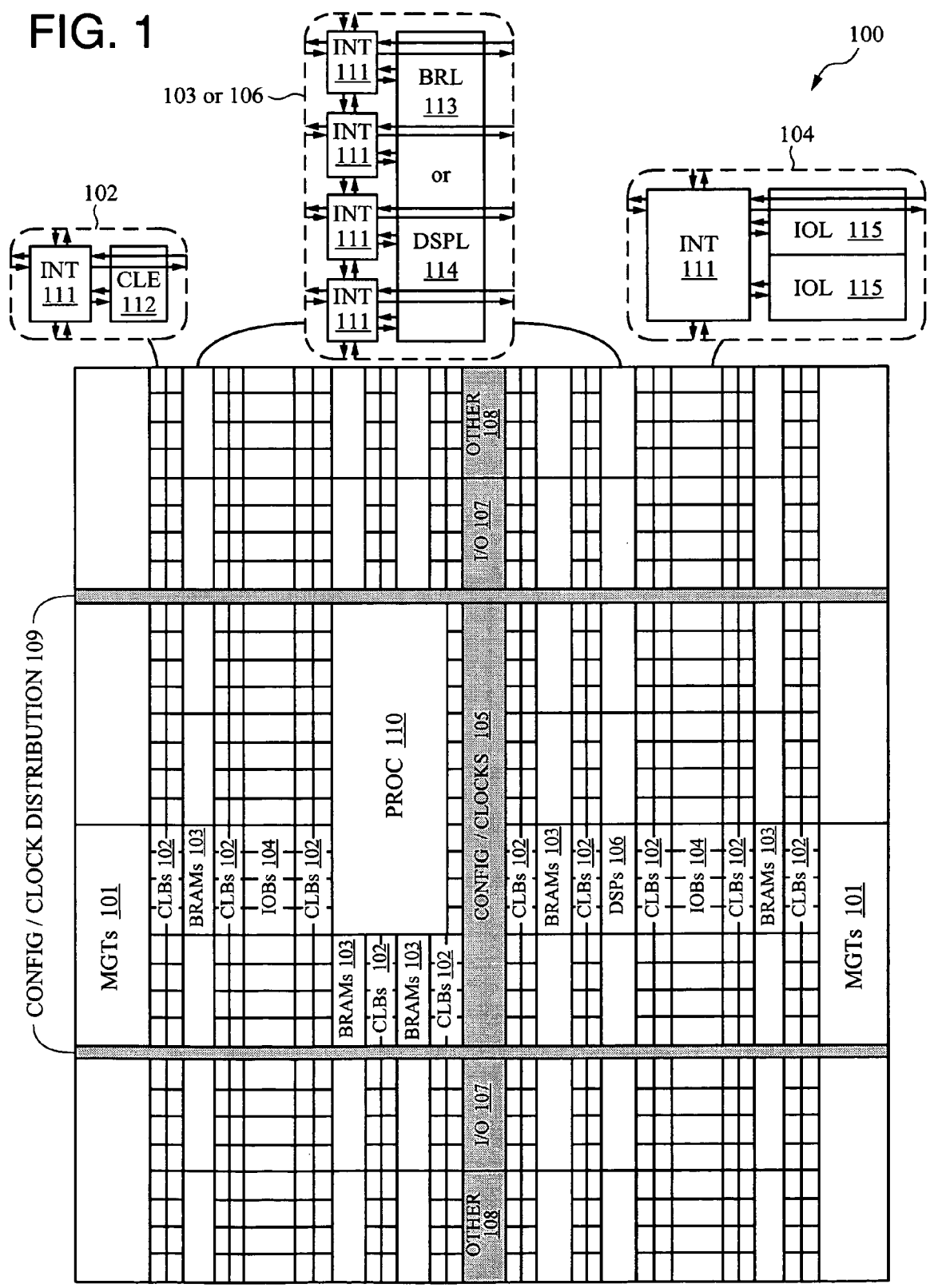
FIG. 1 is a block diagram depicting an exemplary embodiment of an FPGA architecture.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element, within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. Examples of FPGAs that may be used with embodiments of the invention, are the Virtex 2 and Virtex 4 FPGAs available from Xilinx, Inc., San Jose, Calif.

Figure 2:
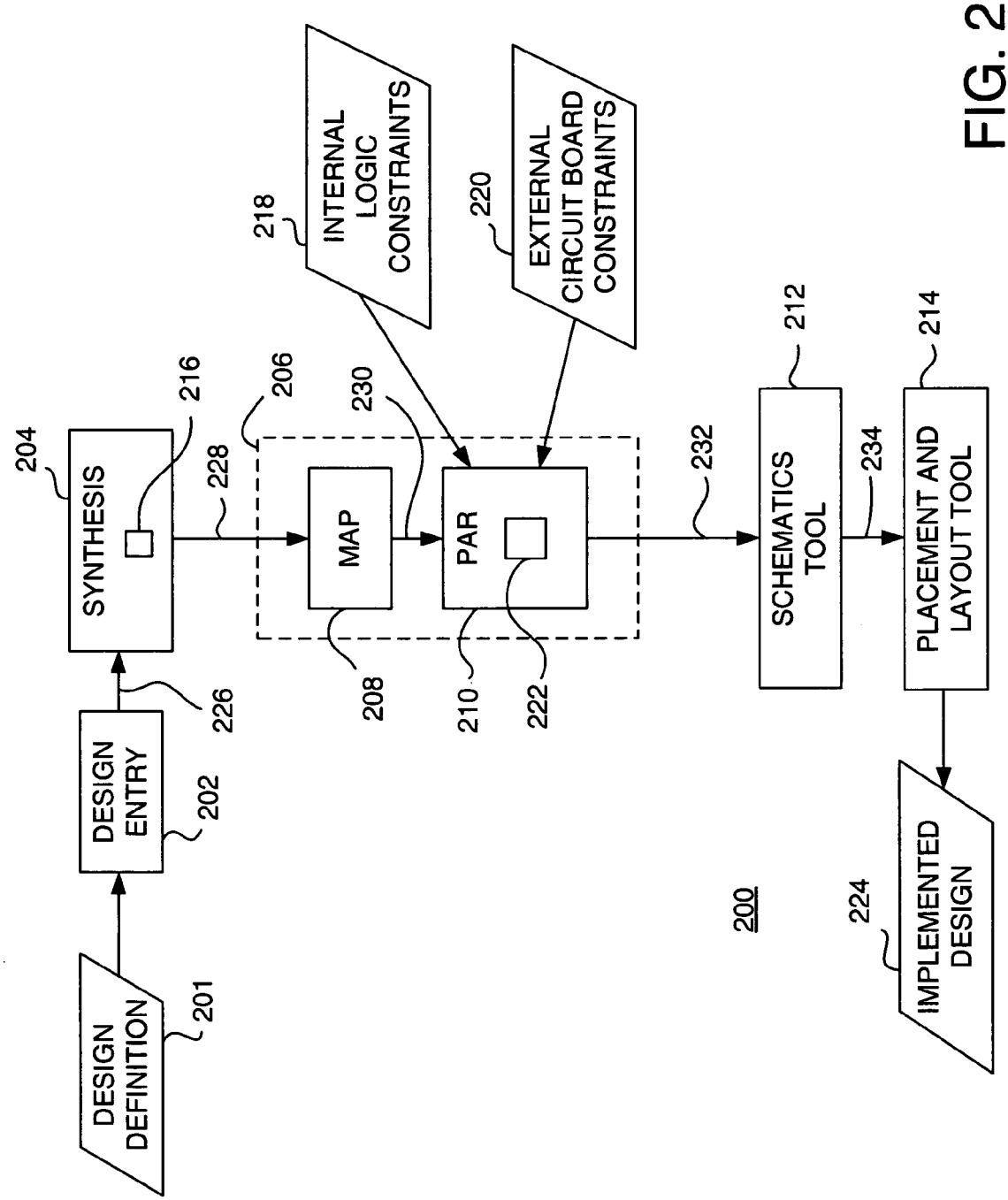
FIG. 2 is a block diagram depicting an exemplary embodiment of an integrated circuit design system constructed in accordance with one or more aspects of the invention.

FIG. 2 is a block diagram depicting an exemplary embodiment of an integrated circuit design system 200 constructed in accordance with one or more aspects of the invention. The system 200 includes a design entry tool 202, a synthesis tool 204, an implementation tool 206, a schematic generation tool 212, and a placement and layout tool 214. In the present embodiment, the system 200 is configured to implement a circuit design using one or more target FPGAs on a circuit board. The implementation tool 206 includes a map tool 208 and a place-and-route (PAR) tool 210. The design system 200 may be implemented using the computer 600 shown in FIG. 6 and described below. Notably, the tools may be part of one or more software programs stored in a memory and configured for execution by a central processing unit (CPU).

In particular, the design entry tool 202 is configured to receive a design definition 201 and generate a functional description 226 (also referred to as a function representation) of the circuit design. The design definition 201 includes a plurality of circuit elements, such as flip-flops, memories, LUTs, and the like, connected together via signal conductors (signals). The design entry tool 202 may include a graphic interface through which a designer connects symbols and blocks representing various components to produce a schematic description of the circuit design. The design entry tool 202 may also include a text interface through which a designer writes hardware description language (HDL) code to produce a structural and/or behavioral description of the circuit design in terms of HDL constructs. Examples of HDLs include the Very high-speed integrated circuit Hardware Description Language (VHDL) and VERILOG.

Figure 3:
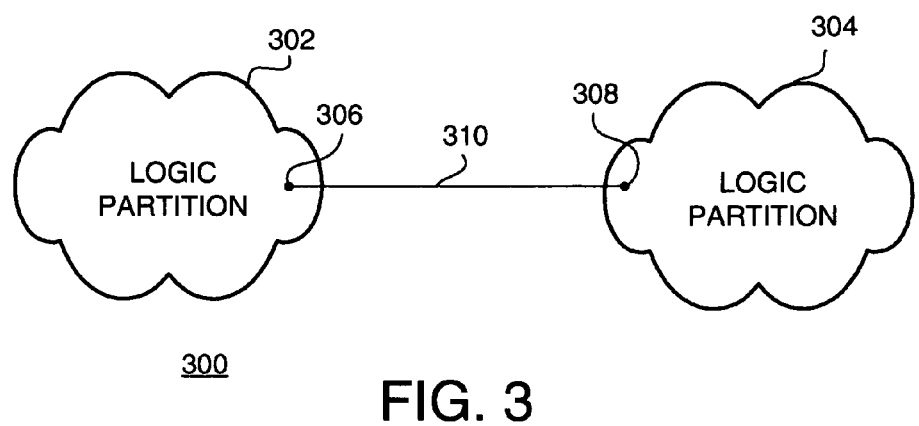
FIG. 3 is a block diagram depicting an illustrative circuit design in accordance with one or more aspects of the invention.

The synthesis tool 204 is configured to receive the functional design data 226. In one embodiment, the synthesis tool 204 includes a logic partitioning module 216 for generating one or more logic partitions from the functional design data 226. For example, FIG. 3 is a block diagram depicting an illustrative circuit design 300 in accordance with one or more aspects of the invention. The circuit design 300 includes a logic partition 302 and a logic partition 304. Each of the logic partitions 302 and 304 include various circuit elements connected by signal conductors (not shown). The logic partition 302 is coupled to the logic partition 304 by an external signal 310. An "external signal" represents a connection between logic partitions. The logic partition 302 is connected to the external signal 310 by a pin 306, and the logic partition 302 is connected to the external signal 310 by a pin 308. A "pin" is a logical connection of a partition to an external signal. For purposes of clarity by example, two logic partitions are shown connected by an external signal. It is to be understood that a circuit design may include any number of logic partitions and any number of external signals between such logic partitions.

Returning to FIG. 2, the synthesis tool 204 processes the functional design data 226 to produce logical design data 228 (i.e., a logical representation of the circuit design) having one or more logic partitions. As described below, each logic partition is implemented using a separate FPGA on the circuit board, and each external signal is implemented via a trace on the circuit board. The logical design data 228 may include one or more logical network lists ("netlists") supported by the target FPGA(s). For example, the synthesis tool 204 may process HDL code of the functional design data 226 to produce a netlist. The HDL synthesis process is well known in the art.

The map tool 208 is configured to receive the logical design data 228. The map tool 208 maps the logical design data 228 onto primitive components within the target FPGA (s) (i.e., the blocks and signals are mapped onto CLBs, IOBs, etc. of the target FPGA(s)). The map tool 208 produces mapped design data 230.

The PAR tool 210 is configured to receive the mapped design data 230, as well as internal logic constraint data 218 and external circuit board constraint data 220. The external circuit board constraint data 220 includes constraints for at least one of: trace lengths of the circuit board, trace widths of the circuit board, the number of layers of the circuit board, the number of permitted wire crossings on the circuit board, and like type circuit board constraints known in the art. The internal logic constraint data 218 includes timing constraints and the like for the circuit design. For example, the internal logic constraint data 218 may include timing constraints for each logic partition in the logical design data 228.

The PAR tool 210 includes a global cost function 222 for processing the mapped design data 230, the internal logic constraint data 218, and the external circuit board constraint data 220 to produce physical design data 232 for the target FPGA(s) (i.e., a physical representation of the circuit design for the target FPGA(s)). In one embodiment, the global cost function 222 includes two phases: a pin assignment phase and a place and route phase. In the pin assignment phase, for each logic partition, the global cost function 222 assigns logic pins in to input/output (I/O) elements of an FPGA based on the external circuit board constraint data 220. Note that if multiple FPGAs are employed, the pin assignment process is performed concurrently for each of the FPGAs. The global cost function 222 produces pin constraint data as a result of the pin assignment phase. In the place and route phase, for each logic partition, the global cost function 222 places the primitive components within the target FPGA and routes interconnects (e.g., signal conductors of the programmable interconnect) for the placed components based on the pin constraint data from the pin assignment phase and the internal logic constraint data 218. Note that if multiple FPGAs are employed, the problem is solved only if the internal logic constraints for each of the FPGAs are satisfied concurrently.

Figure 4:
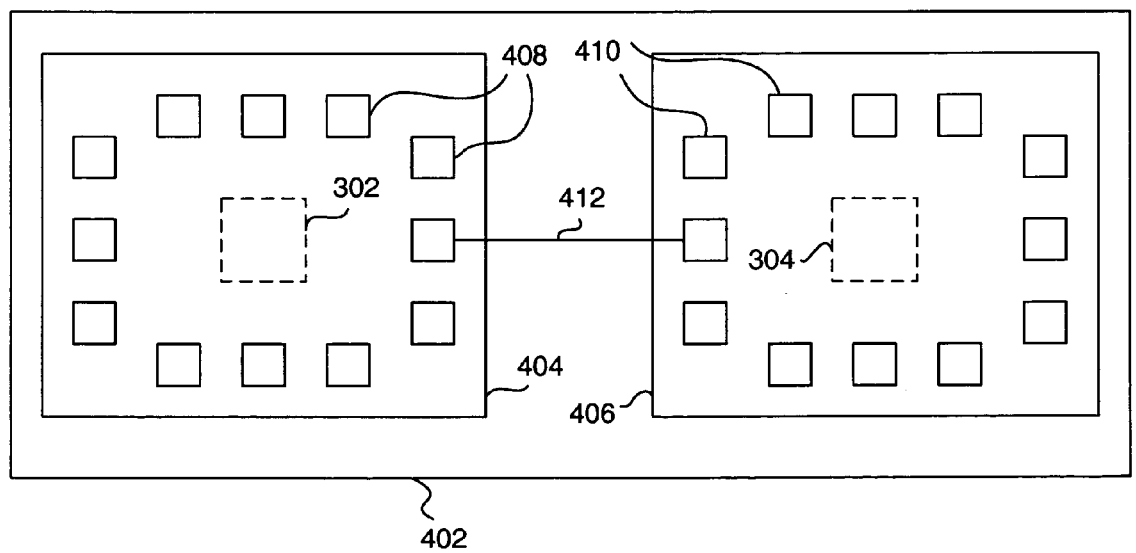
FIG. 4 is a block diagram depicting an exemplary embodiment of a physical implementation of the circuit design of FIG. 3 in accordance with one of more aspects of the invention.

For example, FIG. 4 is a block diagram depicting an exemplary embodiment of a physical implementation 400 of the circuit design 300 of FIG. 3 in accordance with one of more aspects of the invention. The physical implementation 400 includes a circuit board 402 having an FPGA 404 and an FPGA 406. The FPGA 404 includes I/O blocks 408, and the FPGA 406 includes I/O blocks 410. The FPGA 404 is configured with the logic partition 302, and the logic pin 306 is mapped to one of the I/O blocks 408. The FPGA 406 is configured with the logic partition 304, and the logic pin 308 is mapped to one of the I/O blocks 410. The external signal 310 is implemented using a trace 412 on the circuit board 402. Those skilled in the art will appreciate that a circuit design may include more than two logic partitions, and thus the circuit board 402 may include more than two FPGAs for implementing such logic partitions. In addition, the circuit board 402 may include a plurality of traces on one or more layers interconnecting the FPGAs, as well as other components.

Returning to FIG. 2, the global cost function 222 performs the pin assignment process in a manner optimized for circuit board level routing (i.e., routing between logic partitions). In some cases, the global cost function 222 may not be able to place and route a particular logic partition in an FPGA such that the internal logic constraint data 218 is satisfied. In such a case, the global cost function 222 produces constraint failure data. For example, the constraint failure data may include the identity of a particular signal within a logic partition that cannot be routed in a manner that satisfies a timing constraint. In such a case, the global cost function 222 re-executes the pin assignment phase to produce new pin constraints using the constraint failure data as parametric input. For example, the global cost function 222 may re-assign one or more pins (i.e., perform one or more pin swaps) such that the constraint failing signal can be routed in a manner that obviates the failure. The global cost function 222 then performs the place and route phase using the new pin constraints. This process may be iterated until each logic partition is placed and routed in an FPGA. In this manner, the PAR tool 210 produces physical design data 232 for the target FPGA(s) and the circuit board (i.e., a physical representation of the circuit design for the target FPGA(s) on the circuit board). The PAR tool 210 advantageously produces physical design data that both satisfies internal logic constraints for the FPGA(s) and is optimized for circuit board level routing.

In another embodiment, the global cost function 222 first performs the placement and routing process for the FPGA(s) in accordance with the internal logic constraints to produce place and route constraints for the FPGA(s). The global cost function 222 then performs the pin assignment process in accordance with the place and route constraints and the external circuit board constraints. If the global cost function 222 fails to successfully perform pin assignment, constraint failure data is produced and the place and route process is re-executed using the constraint failure data as parametric input in order to obviate the constraint failures. In yet another embodiment, the global cost function 222 may be a monolithic cost function in which both the external circuit board constraint data 220 and the internal logic constraints 218 are optimized concurrently. In general, the global cost function 222 attempts to place and route the logic partitions in the FPGAs and to produce a pin assignment that satisfies both the internal logic constraints for each of the FPGAs and the external circuit board constraints.

In one embodiment, logic partitioning is performed by the PAR tool 210, rather than in the synthesis tool 204. Notably, the global cost function 222 may be configured to perform the logic partitioning process along with the pin assignment process and the placement and routing process. The global cost function 222 may intelligently partition the logic of the circuit design into multiple FPGAs while concurrently accounting for the internal logic constraint data 218 and the external circuit board constraint data 220. That is, the global cost function 222 may attempt to optimize logic partitioning among FPGAs, internal placement and routing within FPGAs, and pin assignments concurrently. If placement and routing and/or pin assignment cannot be performed in accordance with the constraints, the global cost function 222 re-executes the logic partitioning process using the constraint failure data as parametric input in order to obviate the constraint failures (internal logic constraint failures, external circuit board constraint failures, or both).

The schematics tool 212 is configured to receive the physical design data 232. The schematics tool 212 automatically produces schematic data 234 for the circuit design with respect to one or more FPGAs on a circuit board based on the particular pin configuration in the physical design data. The process of producing schematic data is automatic, since the physical design data 232 has already been optimized for circuit board level routing.

The placement and layout tool 214 is configured to receive the schematic data 234. The placement and layout tool 214 automatically performs placement and layout of one or more FPGAs on the circuit board, as well as routing of circuit traces, based on the schematic data 234. Again, the process of placement and layout is automatic, since the physical design data 232 has already been optimized for circuit board level routing. The placement and layout tool 214 produces implemented design data 224.

Figure 5:
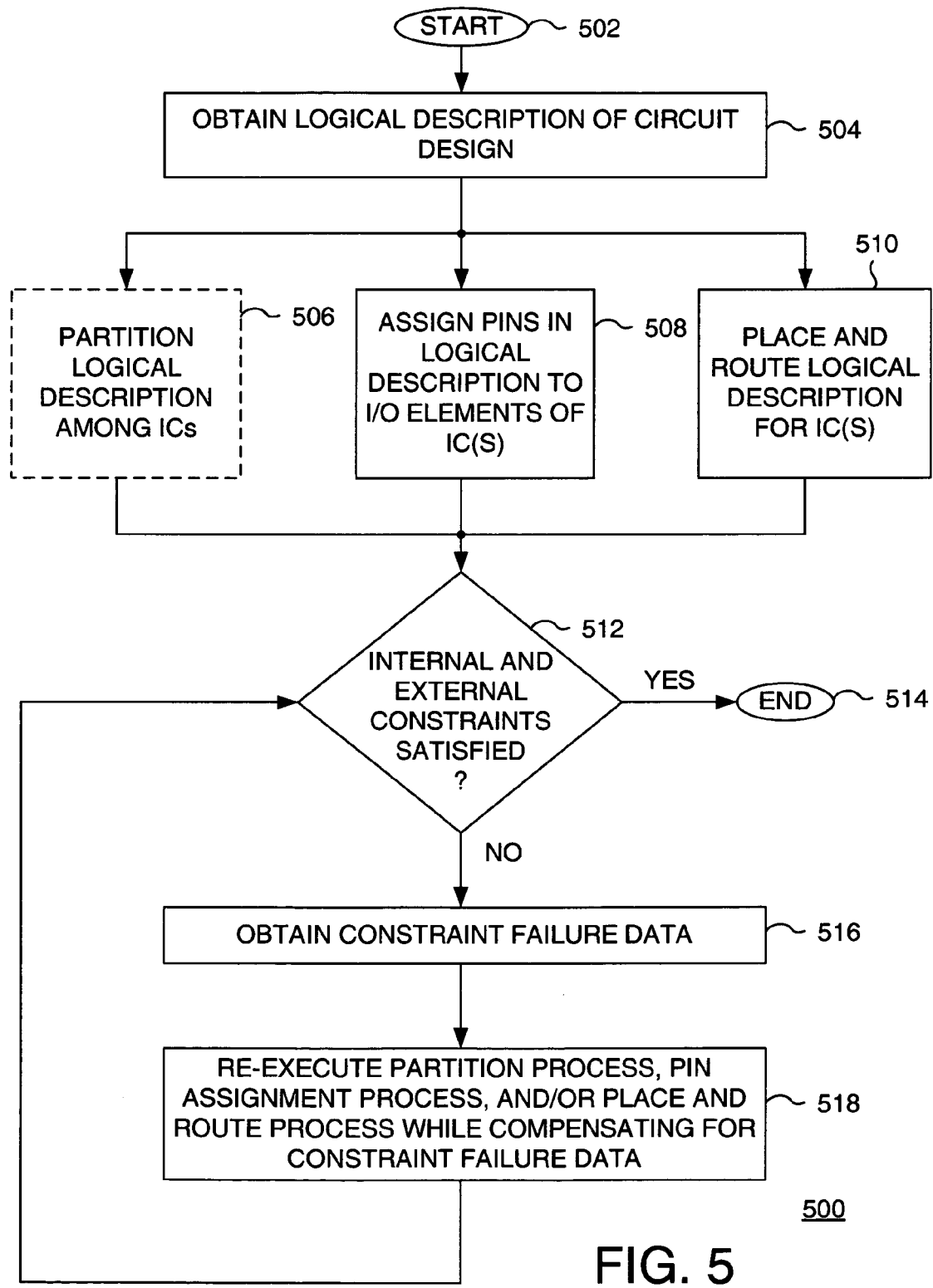
FIG. 5 is a flow diagram depicting an exemplary embodiment of a method for implementing a circuit design for at least one integrated circuit on a circuit board in accordance with one or more aspects of the invention.

FIG. 5 is a flow diagram depicting an exemplary embodiment of a method 500 for implementing a circuit design for at least one integrated circuit on a circuit board in accordance with one or more aspects of the invention. The method 500 begins at step 502. At step 504, a logical description of the circuit design is obtained. For example, a logical description of the circuit design (e.g., one or more netlists) may be obtained by synthesizing a functional description of the circuit design (e.g., HDL code). At optional step 506, the logical description is partitioned among a plurality of integrated circuits. In another embodiment, the logical description is already partitioned among a plurality of integrated circuits (e.g., during the synthesis process) if more than one integrated circuit is present. At step 508, pins in the logical description are assigned to I/O elements of the IC(s). At step 510, the logical description is placed and routed for the IC(s). Steps 506, 508, and 510 are performed concurrently.

At step 512, a determination is made whether internal and external constraints have been satisfied. As described above, the circuit design is associated with both internal logic constraints for each of the IC(s), as well as external circuit board constraints. Steps 506, 508, and 510 are performed concurrently in an attempt to satisfy both the internal and external constraints. If the internal and external constraints have been satisfied, the method 500 ends at step 514. Otherwise, the method 500 proceeds to step 516. At step 516, constraint failure data is obtained. For example, the constraint failure data may be obtained from the place and route step 510 (e.g., a particular signal fails timing) and/or from the pin assignment step 508. At step 518, the partition process, pin assignment process, and/or place and route process are re-executed while compensating for the constraint failure data. The method 500 then returns to step 512 and repeats until both the internal and external constraints are satisfied. In this manner, the circuit design is implemented such that both the internal logic constraints are satisfied and the pin assignment is optimized for circuit board level routing.

Figure 6:
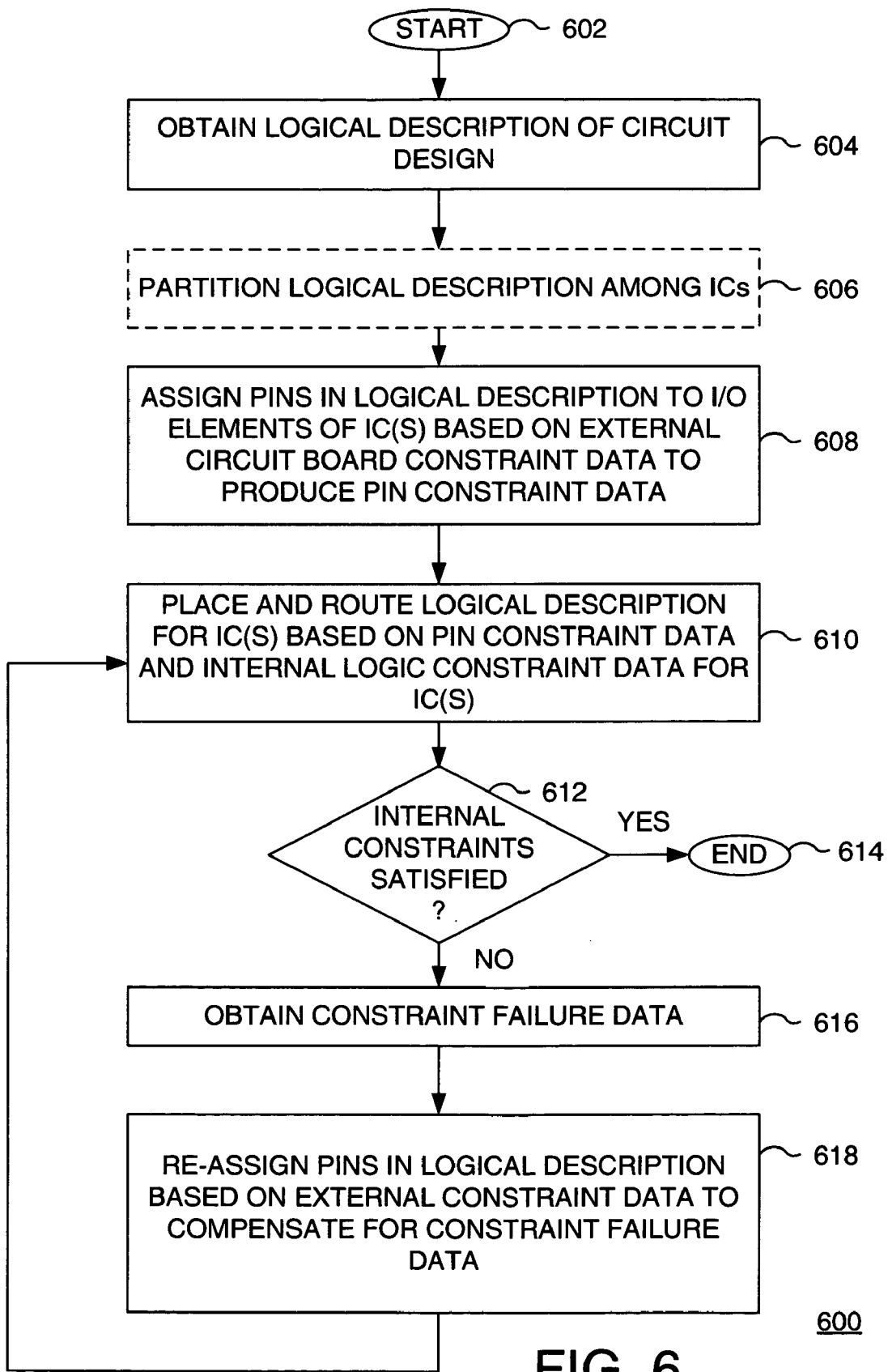
FIG. 6 is a flow diagram depicting another exemplary embodiment of a method for implementing a circuit design for at least one integrated circuit on a circuit board in accordance with one or more aspects of the invention.

FIG. 6 is a flow diagram depicting another exemplary embodiment of a method 600 for implementing a circuit design for at least one integrated circuit on a circuit board in accordance with one or more aspects of the invention. The method 600 begins at step 602. At step 604, a logical description of the circuit design is obtained. At optional step 606, the logical description is partitioned among a plurality of ICs. Alternatively, the logical description may already be partitioned among a plurality of ICs (e.g., during synthesis). At step 608, logic pins in the logical description are assigned to I/O elements of the integrated circuit(s) (IC(s)) based on external circuit board constraint data to produce pin constraint data.

At step 610, the logical description is placed and routed for the IC(s) based on the pin constraint data and internal logic constraint data for the IC(s) (e.g., internal timing constraints). At step 612, a determination is made whether the internal logic constraints have been satisfied. If so, the method 600 ends at step 614. Otherwise, the method 600 proceeds to step 616. At step 616, constraint failure data is obtained. For example, the constraint failure data may be obtained from the place and route step 610. At step 618, logic pins in the logical description are re-assigned to I/O elements of the IC(s) based on the external circuit board constraint data to compensate for the constraint failure data. The method 600 then returns to step 610 and repeats until the internal logic constraints are satisfied. In this manner, the circuit design is implemented such that both the internal logic constraints are satisfied and the pin assignment is optimized for circuit board level routing.

Figure 7:
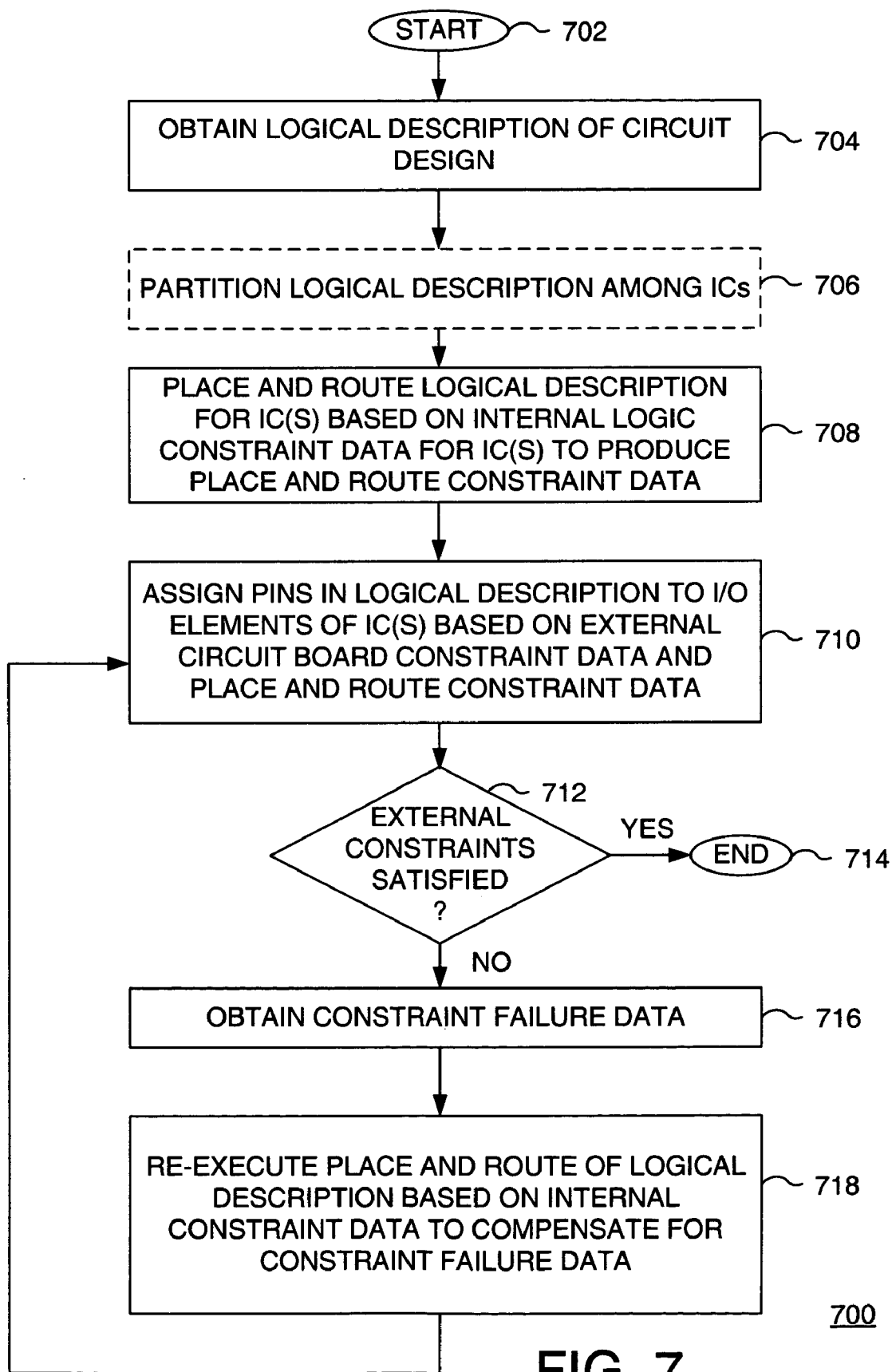
FIG. 7 is a flow diagram depicting yet another exemplary embodiment of a method for implementing a circuit design for at least one integrated circuit on a circuit board in accordance with one or more aspects of the invention.

FIG. 7 is a flow diagram depicting yet another exemplary embodiment of a method 700 for implementing a circuit design for at least one integrated circuit on a circuit board in accordance with one or more aspects of the invention. The method 700 begins at step 702. At step 704, a logical description of the circuit design is obtained. At optional step 706, the logical description is partitioned among a plurality of integrated circuits. In another embodiment, the logical description is already partitioned among a plurality of integrated circuits (e.g., during the synthesis process). At step 708, the logical description is placed and routed for the IC(s) based on internal logic constraint data for the IC(s) to produce place and route constraint data. At step 710, pins in the logical description are assigned to I/O elements of the IC(s) based on external circuit board constraint data and the place and route constraint data.

At step 712, a determination is made whether the external constraints are satisfied. If so, the method 700 ends at step 714. Otherwise, the method 700 proceeds to step 716. At step 716, constraint failure data is obtained. For example, the constraint failure data may be obtained from the pin assignment process. At step 718, the place and route process is re-executed based on the internal constraint data to compensate for the constraint failure data. The method 700 then returns to step 712 and repeats until the external constraints are satisfied.

Figure 8:
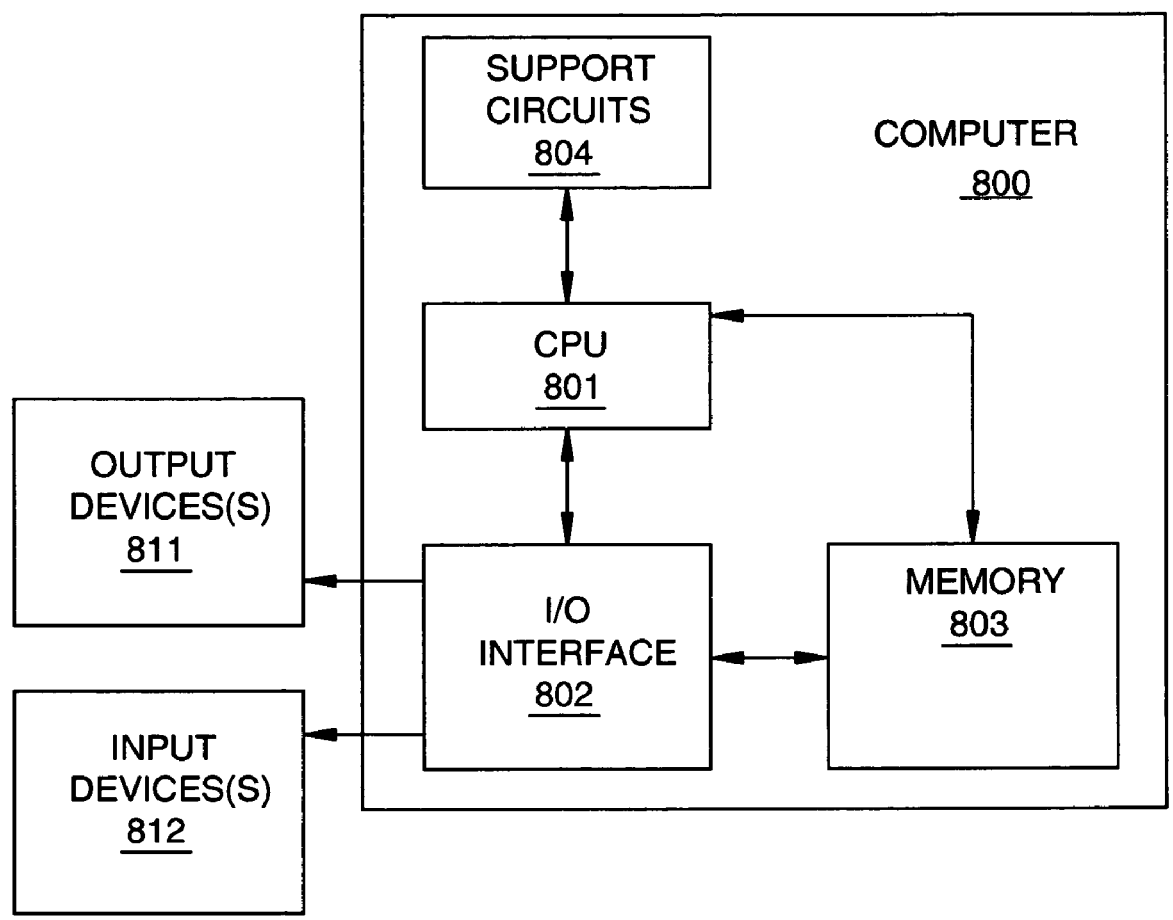
FIG. 8 is a block diagram depicting an exemplary embodiment of a computer suitable for implementing the processes and methods described herein.

FIG. 8 is a block diagram depicting an exemplary embodiment of a computer 800 suitable for implementing the processes and methods described herein. The computer 800 may be used to implement the integrated circuit design system 200 of FIG. 2 and to perform the methods 500, 600, and 700. The computer 800 includes a central processing unit (CPU) 801, a memory 803, various support circuits 804, and an I/O interface 802. The CPU 801 may be any type of microprocessor known in the art. The support circuits 804 for the CPU 801 include conventional cache, power supplies, clock circuits, data registers, I/O interfaces, and the like. The I/O interface 802 may be directly coupled to the memory 803 or coupled through the CPU 801. The I/O interface 802 may be coupled to various input devices 812 and output devices 811, such as a conventional keyboard, mouse, printer, display, and the like.

The memory 803 may store all or portions of one or more programs and/or data to implement the processes, methods, and design tools described herein. Notably, the memory 803 may store a functional description of a circuit design (e.g., schematic or HDL description), external circuit board constraint data, and internal circuit board constraint data. The CPU 801 is configured implement the system 200 and the methods 500, 600, and 700 to process the data stored in the memory 803. Although one or more aspects of the invention are disclosed as being implemented as a computer executing a software program, those skilled in the art will appreciate that the invention may be implemented in hardware, software, or a combination of hardware and software. Such implementations may include a number of processors independently executing various programs and dedicated hardware, such as ASICs.

The computer 800 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 803. The memory 803 may include one or more of the following random access memory, read only memory, magneto-resistive read/write memory, optical read/write memory, cache memory, magnetic read/write memory, and the like, as well as signal-bearing media as described below.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of implementing a circuit design for at least one integrated circuit on a circuit board, comprising:
   obtaining a logical description of the circuit design;
   assigning logical pins in the logical description to input/output (I/O) elements of the at least one integrated circuit, and placing and routing the logical description for the at least one integrated circuit, based on a cost function that is dependent upon external constraint data associated with the circuit board and internal logic constraint data associated with each of the at least one integrated circuit; and
   generating a physical design for the at least one integrated circuit.

2. The method of claim 1, further comprising:
   determining whether the internal logic constraint data and the external constraint data is satisfied;
   if either the internal logic constraint data or the external constraint data is not satisfied, obtaining constraint failure data and repeating the step of assigning to compensate for the constraint failure data.

3. The method of claim 1, wherein the step of assigning the logical pins in the logical description comprises:
   assigning the logical pins to the I/O elements of the at least one integrated circuit based on the external constraint data to produce pin constraint data; and
   placing and routing the logical description for the at least one integrated circuit based on the pin constraint data and the internal logic constraint data.

4. The method of claim 3, further comprising:
   determining whether the internal logic constraint data is satisfied;
   if the internal logic constraint data is not satisfied, obtaining constraint failure data and re-assigning the logical pins in the logical description to the I/O elements based on the external constraint data and the constraint failure data to modify the pin constraint data; and
   repeating the steps of placing and routing, determining, and obtaining the constraint failure data until the internal logic constraint data is satisfied.

5. The method of claim 1, wherein the step of assigning the logical pins in the logical description comprises:
   placing and routing the logical description for the at least one integrated circuit based on the internal logic constraint data to produce place and route constraint data; and
   assigning the logical pins to the I/O elements of the at least one integrated circuit based on the external constraint data and the place and route constraint data.

6. The method of claim 5, further comprising:
   determining whether the external constraint data is satisfied;
   if the external constraint data is not satisfied, obtaining constraint failure data and re-placing and re-routing the logical description based on the internal logic constraint data and the constraint failure data to modify the place and route constraint data; and
   repeating the steps of assigning the logical pins to the I/O elements, determining, and obtaining the constraint failure data until the external constraint data is satisfied.

7. The method of claim 1, further comprising:
   automatically generating schematic data for the circuit design; and
   automatically performing placement and layout of the at least one integrated circuit on the circuit board based on the schematic data.

8. The method of claim 1, wherein the at least one integrated circuit comprises a plurality of integrated circuits and wherein the step of assigning further comprises:
   partitioning the logical description among the plurality of integrated circuits.

9. The method of claim 1, wherein the step of obtaining the logical description comprises:
   obtaining a functional description of the circuit design;
   synthesizing the functional description to produce the logical description.

10. The method of claim 9, wherein the at least one integrated circuit comprises a plurality of integrated circuits, and wherein the step of synthesizing comprises:
    partitioning the logical description among the plurality of integrated circuits.

11. The method of claim 1, wherein the external constraint data comprises constraints based on at least one of trace lengths on the circuit board, trace widths on the circuit board, a number of layers of the circuit board, or a number of wire crossings permitted on the circuit board.

12. A system for implementing a circuit design for at least one integrated circuit on a circuit board, comprising:
    a synthesis tool for synthesizing a functional description of the circuit design to produce a logical description; and
    a place and route tool for assigning logical pins in the logical description to input/output (I/O) elements of the at least one integrated circuit, and placing and routing the logical description for the at least one integrated circuit, based on a cost function that is dependent upon external constraint data associated with the circuit board and internal logic constraint data associated with each of the at least one integrated circuit;
    wherein the system generates a physical design for the at least one integrated circuit.

13. The system of claim 12, wherein the place and route tool is further configured to determining whether the internal logic constraint data and the external constraint data is satisfied, and if either the internal logic constraint data or the external constraint data is not satisfied at step, obtain constraint failure data and repeat pin assignment and place and route to compensate for the constraint failure data.

14. The system of claim 12, wherein the place and route tool is configured to assign the logical pins to the I/O elements of the at least one integrated circuit based on the external constraint data to produce pin constraint data, and place and route the logical description for the at least one integrated circuit based on the pin constraint data and the internal logic constraint data.

15. The system of claim 12, wherein the place and route tool is configured to place and route the logical description for the at least one integrated circuit based on the internal logic constraint data to produce place and route constraint data, and assign the logical pins to the I/O elements of the at least one integrated circuit based on the external constraint data and the place and route constraint data.

16. The system of claim 12, further comprising:
  a schematic tool for automatically generating schematic data for the circuit design; and
  a placement and layout tool for automatically performing placement and layout of the at least one integrated circuit on the circuit board based on the schematic data.

17. The system of claim 15, wherein the at least one integrated circuit comprises a plurality of integrated circuits, and wherein the synthesis tool is configured to partition the functional description among the plurality of integrated circuits.

18. The system of claim 15, wherein the at least one integrated circuit comprises a plurality of integrated circuits, and wherein the place and route tool is configured to partition the functional description among the plurality of integrated circuits.

19. The system of claim 15, wherein the external constraint data comprises constraints based on at least one of trace lengths on the circuit board, trace widths on the circuit board, a number of layers of the circuit board, or a number of wire crossings permitted on the circuit board.

20. Apparatus for implementing a circuit design for at least one integrated circuit on a circuit board, comprising:
  means for obtaining a logical description of the circuit design;
  means for assigning logical pins in the logical description to input/output (I/O) elements of the at least one integrated circuit, and placing and routing the logical description for the at least one integrated circuit, based on a cost function that is dependent upon external constraint data associated with the circuit board and internal logic constraint data associated with each of the at least one integrated circuit; and
  means for generating a physical design for the at least one integrated circuit.

* * * * *